(12) United States Patent
Yatsu

(10) Patent No.: US 6,621,285 B1
(45) Date of Patent: Sep. 16, 2003

(54) SEMICONDUCTOR CHIP HAVING A PAD ARRANGEMENT THAT ALLOWS FOR SIMULTANEOUS TESTING OF A PLURALITY OF SEMICONDUCTOR CHIPS

(75) Inventor: Tsunehiko Yatsu, Tatebayashi (JP)

(73) Assignee: Sanyo Electric Co. Ltd. (JP)

( * ) Notice: Subject to any disclaimer, the term of this patent is extended or adjusted under 35 U.S.C. 154(b) by 0 days.

(21) Appl. No.: 09/537,379

(22) Filed: Mar. 29, 2000

(30) Foreign Application Priority Data

Mar. 29, 1999 (JP) .......................................... 11-086807

(51) Int. Cl.⁷ .............................................. G01R 31/26
(52) U.S. Cl. ...................................................... 324/765
(58) Field of Search ................................. 324/754, 755, 324/765, 761, 762, 158.1, 73.1; 365/200, 201; 438/14–18

(56) References Cited

U.S. PATENT DOCUMENTS

| 3,781,683 A | * | 12/1973 | Freed .......................... 324/73.1 |
| 4,220,917 A | * | 9/1980 | McMahon, Jr. .............. 257/773 |
| 5,239,191 A | * | 8/1993 | Sakumoto et al. .......... 257/203 |
| 5,506,499 A | * | 4/1996 | Puar ............................. 29/847 |

* cited by examiner

Primary Examiner—Vinh P. Nguyen
(74) Attorney, Agent, or Firm—Cantor Colburn LLP

(57) ABSTRACT

The pad arrangement of a semiconductor chip allows simultaneous testing of a plurality of semiconductor chips. A plurality of semiconductor chips are arranged on a wafer, each including a plurality of signal input/output pads arranged along four sides for inputting/outputting a signal to/from a semiconductor device, and a measurement pad arranged along opposing two of the four sides, and electrically connected to the plurality of signal input/output pads arranged along the other two opposing sides. Such arrangement enables simultaneous testing of a plurality of semiconductor chips.

3 Claims, 5 Drawing Sheets

SEMICONDUCTOR CHIP HAVING A PAD ARRANGEMENT THAT ALLOWS FOR SIMULTANEOUS TESTING OF A PLURALITY OF SEMICONDUCTOR CHIPS

BACKGROUND OF THE INVENTION

1. Field of the Invention

The present invention relates to a semiconductor chip and to a method for testing operation of such a semiconductor chip. More particularly, the present invention discloses a semiconductor chip provided with a plurality of pads for input and output of signals, and a method for testing operation state of a plurality of semiconductor chips arranged in a matrix on a wafer.

2. Description of the Related Art

Integrated circuits (ICs) are mass-produced in the following manner. A wafer provided with a plurality of semiconductor chips arranged in a matrix is diced into individual semiconductor chips. After each of the thus divided semiconductor chips is mounted to a package, pads of the semiconductor chip used for input and output of signals are connected with bonding wires to an island of the package formed of copper, iron, or the like. A semiconductor chip thus connected to the package by means of bonding wires is molded with protective resin, thereby forming an IC. Defective ICs among those produced must be separated before the ICs are delivered to customers. Therefore, before dicing the wafer into individual semiconductor chips, the chips are tested using a tester to identify defective chips, which are removed before being shipped to a customer. Such testing is usually performed with a tester by bringing the signal input/output (I/O) pads of the chip into contact with a probe mounted to the tester and commonly formed of tungsten or the like, and supplying a signal, such as a control signal, to the signal I/O pads from the probe under the control of the tester to detect operation state of the semiconductor chip. When the semiconductor chip does not operate as expected, the chip is determined to be defective.

Semiconductor chips can be roughly divided into multi-pin semiconductor chips having a relatively large number of pins, and those representing a fewer pin type. FIG. 3 is a plan view illustrating a conventional multi-pin type semiconductor chip 200. On the chip 200, 25 pads are disposed along each of its four sides. More specifically, on the multi-pin type semiconductor chip 200, pads 1–25 are arranged on one side, pads 26–50 on an adjacent side, pads 51–75 on the next side, and pads 76–100 on the remaining side. When the multi-pin type semiconductor chip 200 is a one-chip microcomputer, verification may sometimes be required as to whether or not data stored in a ROM is correct. When a ROM has a storage capacity of, for example, 64 kB, 28 pads are required to verify operation of the ROM, namely, 16 pads for supplying address data, 8 pads for reading and writing data, and 4 pads for controlling the ROM. FIG. 4 is a plan view illustrating a plurality of multi-pin semiconductor chips 200 having these 28 pads on the opposing two sides, each contacted by the probe of the tester. An arrow in the figure indicates the position of the probe. While 25 pads are arranged along each of the four sides of the multi-pin type semiconductor device 200, some of the pads on the opposing two sides, i.e. pads 1–25 and 51–75, serve as the above 28 pads. By thus arranging pads for verifying operation of the ROM on the opposing two sides, a plurality of multi-pin type semiconductor chips can be simultaneously brought into contact with the probes of the tester, achieving simultaneous testing of a plurality of multi-pin type semiconductor chips. FIG. 5 is a plan view illustrating a conventional fewer pin type semiconductor chip 300, where 7 pads are arranged on each of four sides. More specifically, on the semiconductor chip 300, pads 1–7 are arranged on one side, pads 8–15 on an adjacent side, pads 16–22 on the next side, and pads 23–30 on the remaining side. When the semiconductor chip 300 is a one-chip microcomputer and the ROM has a storage capacity of 1 kB, 22 pads are required for verifying operation state of the ROM, namely, 10 pads for supplying address data, 8 pads for reading and writing data, and 4 pads for controlling the ROM.

However, it is impossible, on a fewer pin type semiconductor chip, to arrange 22 pads on just two opposing sides for verifying operation of the ROM, and therefore the pads must be arranged on all four sides. FIG. 6 is a plan view illustrating a plurality of fewer pin type semiconductor chips 400 provided with 22 pads on four sides, and the probe of the tester contacts each of the pads. An arrow in the figure indicates the position of the probe.

As can be seen from FIG. 6, the probe of the tester cannot contact a portion 410 where two chips adjoin, and simultaneous testing of a plurality of fewer pin type semiconductor chips is therefore impossible. In other words, the chips must be tested one at a time, resulting in longer testing times and higher costs.

Further, the size of the package and arrangement of the island therein is determined according to the number of pads on the semiconductor chip. Consequently, if the number of pads provided on the opposing sides of the chip 400 is increased, arrangement of the island must be changed, which increases the cost of the resulting chip. If rearrangement of the island is made by connecting bonding wires in an unspecified manner, a short circuit may be caused between adjacent wires, which again increases final product cost as the short circuited chip must be discarded.

SUMMARY OF THE INVENTION

The present invention aims to provide a semiconductor chip with a pad arrangement that enables simultaneous testing of a plurality of semiconductor chips, and a testing method for simultaneously testing a plurality of semiconductor chips.

According to one aspect of the present invention, a semiconductor chip includes a signal input/output pad disposed at a peripheral region for inputting/outputting a signal to/from a semiconductor device, and a measurement pad disposed on a side other than the side where the signal input/output pad is arranged, and electrically connected to the signal input/output pad.

In the above semiconductor chip, the semiconductor device may be a memory.

According to another aspect of the present invention, a semiconductor chip includes a plurality of signal input/output pads disposed along four sides for inputting/outputting a signal to/from a semiconductor device, and a measurement pad arranged along two opposing sides among the four sides, and electrically connected to the plurality of signal input/output pads arranged on the two remaining opposing sides.

In the above semiconductor chip, the semiconductor device may be a memory.

According to still another aspect of the present invention, a method for testing operation of a semiconductor chip relates to a method for testing operation state of a plurality of semiconductor chips arranged on a wafer in a matrix, and each of the semiconductor chips includes a signal input/output pad arranged at a peripheral region for inputting/outputting a signal to/from a semiconductor device, and a measurement pad arranged on a side other than the side where the signal input/output pad is arranged, and electrically connected to the signal input/output pad. The above method includes the steps of:

(a) inputting/outputting a signal to/from the semiconductor device of the semiconductor chip using the measurement pad, and (b) determining the operation state of the semiconductor chip based on an output of the signal.

In the above method for testing operation of a semiconductor chip, the semiconductor device may be a memory, and step (b) may include a step of detecting content written in the memory.

According to a further aspect of the present invention, the method for testing operation of a semiconductor chip relates to a method for testing operation state of a plurality of semiconductor chips arranged in a matrix on a wafer, and each of the semiconductor chips includes a plurality of signal input/output pads arranged along four sides for inputting/outputting a signal to/from a semiconductor device, and a measurement pad arranged along two opposing sides among the four sides, and electrically connected to the plurality of signal input/output pads arranged along the two remaining opposing sides. The above method includes the steps of:

(a) simultaneously inputting/outputting a signal to/from the plurality of semiconductor chips using the measurement pad, and (b) simultaneously testing the operation state of each of the semiconductor chips based on an output of the signal.

In the above method for testing operation of the semiconductor chip, the semiconductor device may be a memory, and step (b) may include a step of detecting content written in the memory.

DESCRIPTION OF THE PREFERRED EMBODIMENT

A preferred embodiment of the present invention will next be described.

Figure 1:
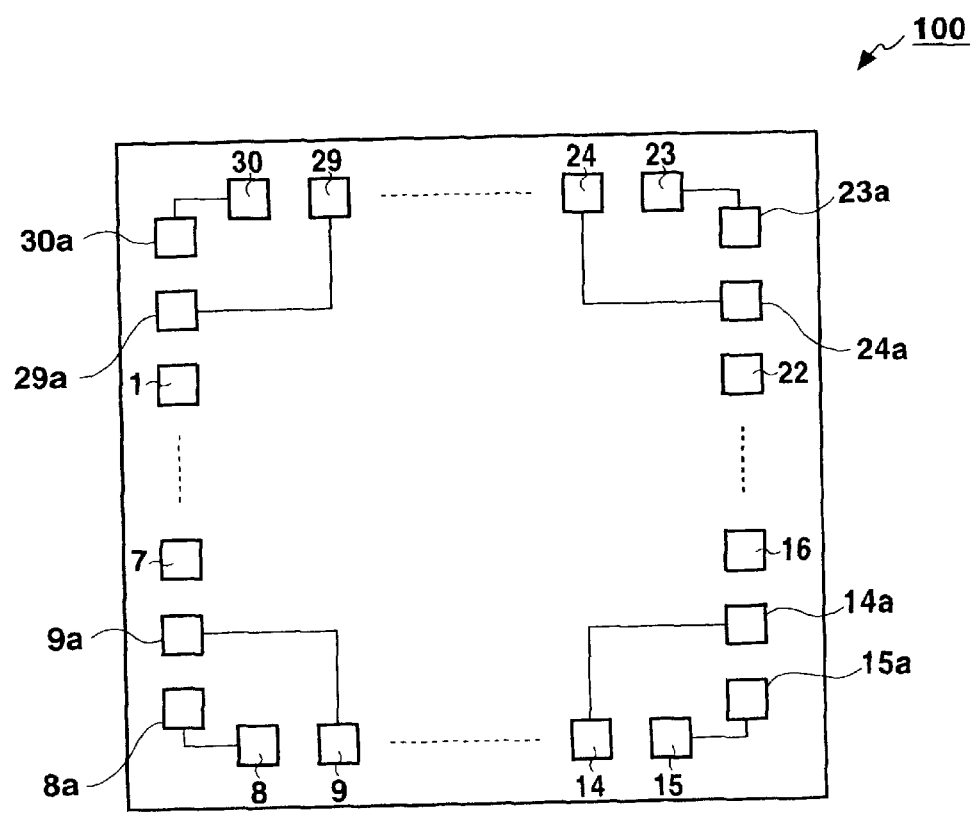
FIG. 1 is a plan view illustrating a semiconductor chip of the fewer pin type according to an embodiment of the present invention.

FIG. 1 is a plan view illustrating a semiconductor chip 100 of the fewer pin type according to one embodiment of the present invention. The chip 100 is a one-chip microcomputer, and includes pads 1–7 arranged along a vertical side, pads 16–22 arranged along the vertical side opposite to the side along which the pads 1–7 are arranged, pads 8–15 arranged along a horizontal side, and pads 23–30 arranged along the horizontal side opposite to the side along which the pads 8–15 are arranged. The following description is based on an example configuration in which 22 signal I/O pads, specifically 10 pads for supplying address data, 8 pads for reading and writing data, and 4 pads for controlling a ROM, are required to conduct a test for verifying operation state of a ROM having a storage capacity of 1 kB, and the pads 1–7, 8, 9, 14, 15, 16–22, 23, 24, 29, and 30 are used as these 22 signal I/O pads. Measuring pads 8a and 9a electrically connected to the pads 8 and 9, respectively, disposed along a horizontal side are arranged outside the pad 7 along the vertical side for the pads 1–7. Similarly, measurement pads 29a and 30a electrically connected to the pads 29 and 30, respectively, disposed along a horizontal side are arranged outside the pad 1 along the vertical side where the pads 1–7 are disposed. Measuring pads 14a and 15a electrically connected to the pads 14 and 15, respectively, disposed along a horizontal side are arranged outside the pad 16 along the vertical side for the pads 16–22. Outside the pad 22, measurement pads 24a and 23a electrically connected to the pads 24 and 23, respectively, arranged along a horizontal side are disposed along the vertical side where the pads 16–22 are arranged.

According to the above arrangement of the measurement pads, the semiconductor chip 100 of the fewer pin type includes 22 pads, each of the opposing two vertical sides having 11 pads. As a result, 22 pads required to perform a test for verifying operation state of the ROM with a storage capacity of 1 kB can be arranged only on the opposing two vertical sides.

Figure 2:
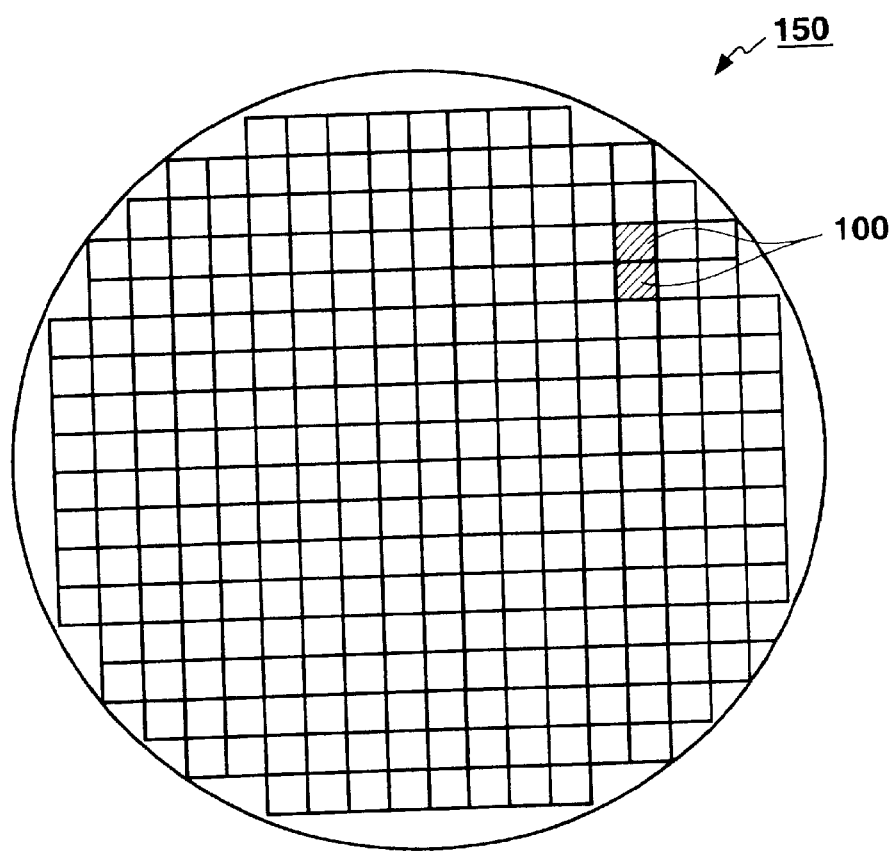
FIG. 2 is a plan view illustrating a wafer on which a plurality of semiconductor chips of the fewer pin type of the present invention are arranged.
Figure 3:
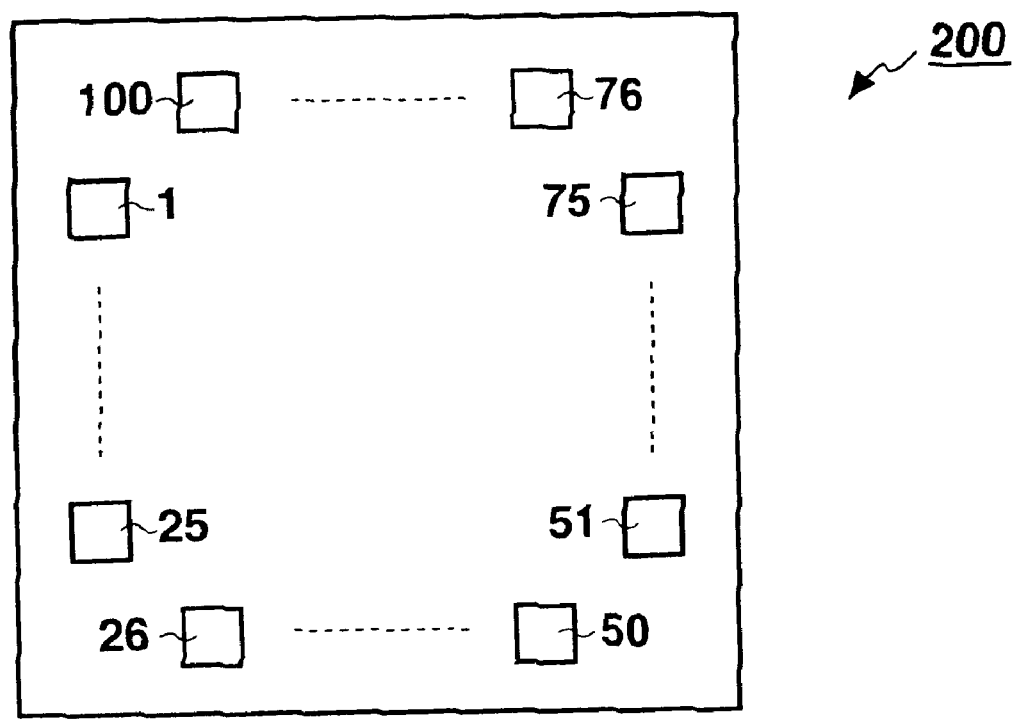
FIG. 3 is a plan view illustrating a conventional multi-pin type semiconductor chip.
Figure 4:
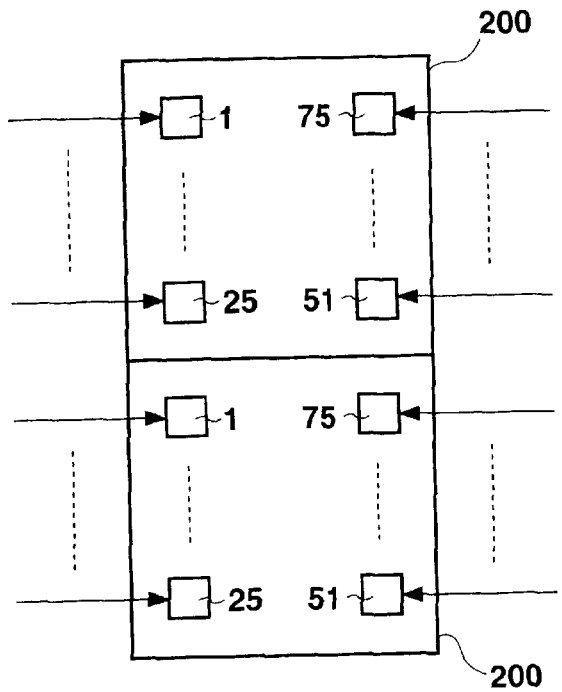
FIG. 4 is a plan view illustrating arrangement of a plurality of conventional multi-pin type semiconductor chips, each pad of which is contacted by a probe of a tester.
Figure 5:
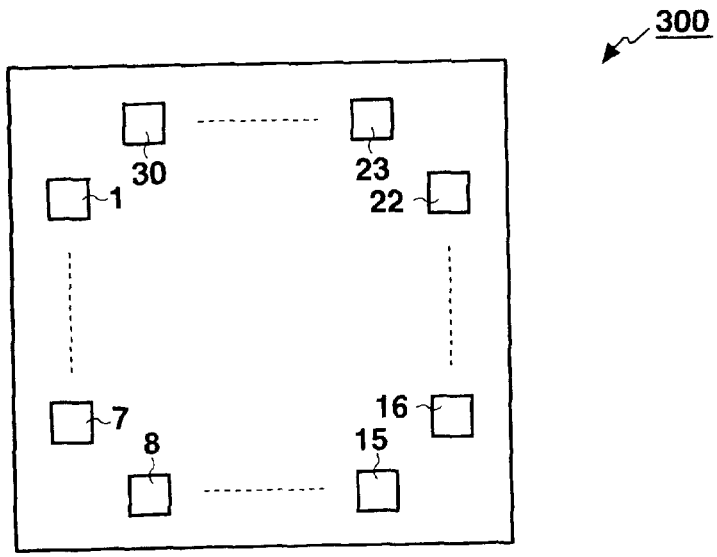
FIG. 5 is a plan view illustrating a conventional semiconductor chip of the fewer pin type.
Figure 6:
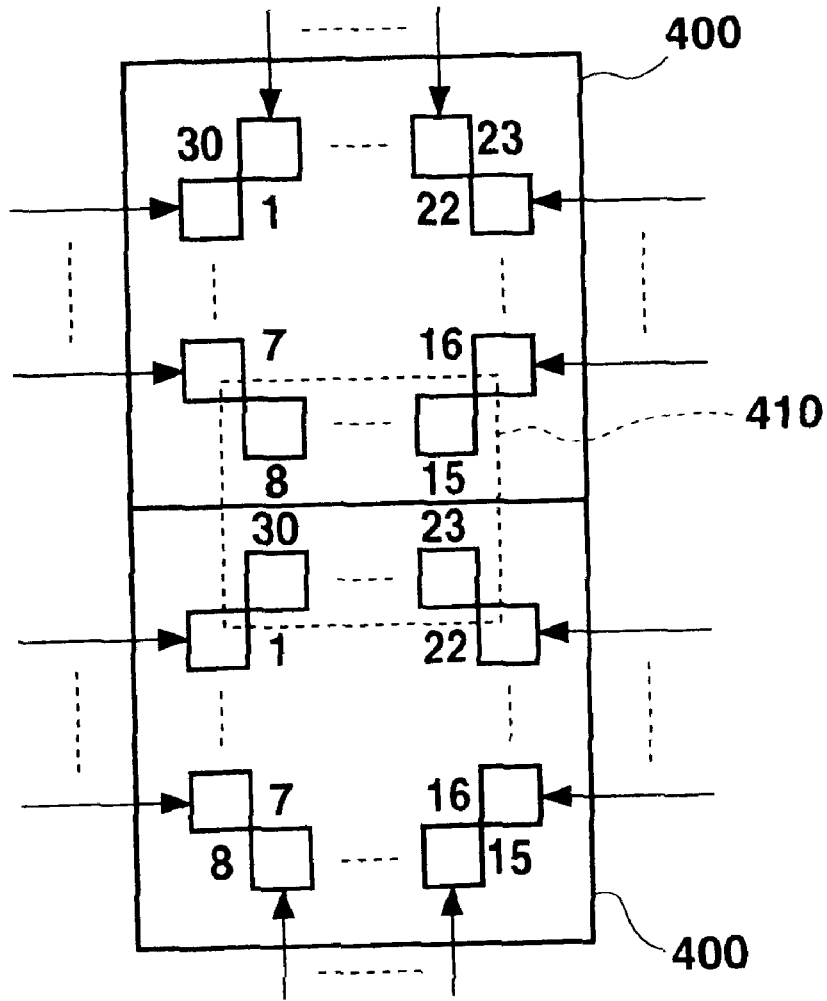
FIG. 6 is a plan view illustrating arrangement of a plurality of conventional semiconductor chips of the fewer pin type, each pad of which is contacted by a probe of a tester.

FIG. 2 is a plan view illustrating a wafer 150 including a plurality of semiconductor chips 100 shown in FIG. 1 arranged in a matrix thereon. On the semiconductor chip 100, the pads required for verifying operation of the ROM are arranged on two opposing vertical sides. Consequently, a signal can simultaneously be input/output to/from each of the plurality of semiconductor chips 100 by bringing a probe of a tester into contact with the semiconductor chips 100 to test the operation state of the chips.

According to the present embodiment, the measurement pads are arranged along the two opposing sides of a semiconductor chip of the fewer pin type, other than the pair of opposing sides where the pads necessary for verifying operation of the ROM are arranged. This configuration makes it possible to simultaneously measure a plurality of semiconductor chips and, therefore, achieve reduction in measurement time and cost. As a result, a low cost semiconductor chip of the fewer pin type can be provided.

In addition, manufacturing costs can be reduced because no changes are required in the arrangement of the island in the package.

It should be noted that, while four measurement pads are provided along the opposing two vertical sides of the semiconductor chip 100 of the fewer pin type in the above description of the preferred embodiment, the number of measurement pads is not limited to four, but may be increased or decreased as required.

Although the above description of the embodiment relates to a semiconductor chip of the fewer pin type, the present invention may also be applied to a semiconductor chip of the multiple pin type.

What is claimed is:

1. A semiconductor chip, comprising:
   a plurality of signal input/output pads arranged along four sides for inputting/outputting a signal to/from the semiconductor chip; and
   a plurality of measurement pads arranged along two opposing sides among said four sides, each of said plurality of measurement pads being electrically connected to one of said plurality of signal input/output pads arranged on the two remaining opposing sides.

2. The semiconductor chip according to claim 1, wherein said semiconductor chip is a memory.

3. A method for testing operation stale of a plurality of semiconductor chips arranged in a matrix on a wafer, each of said plurality of semiconductor chips including
   a plurality of signal input/output pads arranged along four sides for inputting/outputting a signal to/from the semiconductor chip,
   a plurality of measurement pads arranged along two opposing sides among said four sides, each of said plurality of measurement pads electrically connected to one of said plurality of signal input/output pads arranged along the two remaining opposing sides, said method comprising the steps of:
   (a) simultaneously inputting/outputting a signs to/from said plurality of semiconductor chips using said measurement pad; and
   (b) simultaneously testing the operation state of each of said plurality of semiconductor chips based on an output of said signal.

* * * * *